(12) United States Patent
Fukui

(10) Patent No.: US 6,774,541 B1
(45) Date of Patent: Aug. 10, 2004

(54) PIEZOELECTRIC ELEMENT, PROCESS FOR PRODUCING THE PIEZOELECTRIC ELEMENT, AND HEAD FOR INK-JET PRINTER USING THE PIEZOELECTRIC ELEMENT

(75) Inventor: Toshimi Fukui, Kyoto (JP)

(73) Assignee: KRI, Inc., Osaka (JP)

( * ) Notice: Subject to any disclaimer, the term of this patent is extended or adjusted under 35 U.S.C. 154(b) by 81 days.

(21) Appl. No.: 09/714,820

(22) Filed: Nov. 17, 2000

(30) Foreign Application Priority Data

Nov. 18, 1999 (JP) .......................................... 11-327957

(51) Int. Cl.⁷ .......................................... H01L 41/187
(52) U.S. Cl. .................................... 310/358; 310/324
(58) Field of Search .......................................... 310/358

(56) References Cited

U.S. PATENT DOCUMENTS

| | | | | |
|---|---|---|---|---|
| 2,486,968 A | * | 11/1949 | Moulton ................ | 106/287.16 |
| 5,754,205 A | * | 5/1998 | Miyata et al. ............. | 29/25.35 |
| 6,037,703 A | * | 3/2000 | Kambe et al. ............. | 29/25.35 |
| 6,113,225 A | * | 9/2000 | Miyata et al. ................ | 347/70 |
| 6,376,090 B1 | * | 4/2002 | Kijima ....................... | 428/469 |

FOREIGN PATENT DOCUMENTS

| | | | |
|---|---|---|---|
| JP | 5-124188 | 5/1993 | ............ B41J/2/045 |
| JP | 10-217458 | 8/1998 | ............ B41J/2/045 |
| JP | 10-120499 | * 12/1998 | ............ C30B/33/00 |

* cited by examiner

Primary Examiner—Thomas M. Dougherty
(74) Attorney, Agent, or Firm—McDermott, Will & Emery

(57) ABSTRACT

An element having certain superior piezoelectric characteristics at all times and of which process control in production of the element is relatively easy. In a piezoelectric element in which electrodes 6, 8 are arranged on both face sides of a piezoelectric film 7 respectively, the piezoelectric film is provided with an oxide layer 7a containing 0 or not more than 15 weight percent of Pb arranged on a face of the piezoelectric film, the face being in contact with the electrode, and the oxide layer being formed of a composite oxide expressed by a chemical formula $ABO_3$ or of a solid solution of one or not less than two kinds of composite oxides respectively expressed by the chemical formula $ABO_3$.

9 Claims, 4 Drawing Sheets

PRIOR ART

PIEZOELECTRIC ELEMENT, PROCESS FOR PRODUCING THE PIEZOELECTRIC ELEMENT, AND HEAD FOR INK-JET PRINTER USING THE PIEZOELECTRIC ELEMENT

BACKGROUND OF THE INVENTION

1. Field of the Invention

The present invention relates to a piezoelectric element for use in, for example, an actuator for changing capacity of ink chamber in order to jet ink filled in the ink chamber from an ink nozzle through an ink passage in an ink-jet printer head, a process for producing the piezoelectric element, and an ink-jet printer head which is constructed using the piezoelectric element.

2. Prior Art

An ink-jet printer head is generally composed of a head base, a diaphragm, and an actuator. A part of the head is enlargedly and schematically shown in FIG. 5. A head base 11 is provided with a large number of ink nozzles for jetting ink, a large number of ink passages separately communicating to the respective ink nozzle, and a large number of ink chambers 12 separately communicating to the respectively ink passages. (FIG. 5 shows only one of the ink chambers 12, and illustration of the ink passages and the ink nozzles is omitted.) A diaphragm 13 is mounted so as to cover the whole upper face of the head base 11, and the diaphragm 13 closes upper face openings of all the ink chambers 12 of the head base 11. On the diaphragm 13, piezoelectric elements 15 for giving vibration driving force to the diaphragm 13 are mounted and formed on positions separately corresponding to the respective ink chambers 12. A power source 19 of an actuator 14 provided with a large number of piezoelectric elements 15 is controlled and voltage is applied to a desired and selected piezoelectric element 15, whereby the piezoelectric element 15 is displaced and the part of the diaphragm 13 is vibrated. As a result, capacity of an ink chamber 12 which is located at the part corresponding to the vibration of the diaphragm 13 is changed, and ink is pushed out from the jet nozzle through the ink passage.

Each of the piezoelectric elements 15 is constructed by forming a piezoelectric film 17 on a lower electrode 16 and forming an upper electrode 18 on the piezoelectric film 17 so as to sandwich the piezoelectric film 17 between the lower electrode 16 and the upper electrode 18. The piezoelectric film 17 is generally made of lead titanate zirconate (Pb(Zr, Ti)$O_3$; PZT) or made of a material mainly composed of PZT. The piezoelectric film 17 having such composition is formed by sputtering method, vacuum deposition method, CVD method, laser ablation method, sol-gel method, thick film method (a method using piezoelectric paste), and so on.

For example, the Japanese Patent Publication (unexamined) No. 217458/1998 discloses a process for forming a piezoelectric film made of PZT, in which an organic raw material of PZT is spin coated on a lower electrode, dried, and degreased, and after repeating the process of applying the organic raw material, drying, and degreasing several times, burning is conducted and a piezoelectric film is obtained. When a PZT film to be a piezoelectric film is prepared by the mentioned method, a low dielectric substance, which has pyrochlore structure or is amorphous, whose dielectric constant is lower than that of the PZT film consisting of crystals of perovskite structure is formed in a grain boundary exposure region of the piezoelectric film. This Japanese Patent Publication (unexamined) No. 217458/1998 describes that an excess composition produced in the process of growing crystals by burning the piezoelectric film is transferred to a grain boundary along with the growth of PZT crystal grains, and when the neighboring crystal grains finally join to close the grain boundary, the excess composition is pushed out on a surface layer face through the grain boundary, and the low dielectric substance is thus formed. This Japanese Patent Publication (unexamined) No. 217458/1998 explains that the low dielectric substance is formed in the grain boundary exposure region of the piezoelectric film, and consequently, the voltage applied on the crystal grain boundary of the piezoelectric film at the time of applying and electric field is lowered as compared with the voltage in a case where the low dielectric substance is not formed and leakage current flowing through the grain boundary of the piezoelectric film is decreased, and therefore voltage-proof characteristics of the piezoelectric element are improved.

However, in the method in which the leakage current of the piezoelectric element is restrained by forming the low dielectric substance, which has pyrochlore structure or is amorphous, in the grain boundary exposure region of the piezoelectric film as disclosed in Japanese Patent Publication (unexamined) No. 217458/1998, it is difficult to control the process so that the low dielectric substance may be constantly formed at all times in a uniform state in the grain boundary exposure region of the piezoelectric film or on substantially the whole face of the piezoelectric film, and therefore it is difficult to obtain a piezoelectric element which has uniform piezoelectric characteristics at all times.

SUMMARY OF THE INVENTION

The present invention was made to resolve the above-discussed problems and has an object of providing a piezoelectric element in which the piezoelectric element has uniform and excellent piezoelectric characteristics at all times and process control in the production of the piezoelectric element is relatively easy. Another object of the invention is to provide a process for suitably producing such a piezoelectric element. A further object of the invention is to provide an ink-jet printer head in which the mentioned piezoelectric element is used as an actuator.

An invention according to claim 1 provides a piezoelectric element in which electrodes are arranged on both sides of a piezoelectric film respectively, in which the piezoelectric film is provided with an oxide layer containing 0 or not more than 15 weight percent of Pb arranged on a face of the piezoelectric film, the face being in contact with at least one of the electrodes, and said oxide layer being formed of a composite oxide expressed by a chemical formula $ABO_3$ or of a solid solution of one or not less than two kinds of composite oxides respectively expressed by the chemical formula $ABO_3$.

An invention according to claim 2 provides the piezoelectric element according to claim 1, wherein the oxide layer is formed of: a composite oxide a expressed by the chemical formula, $ABO_3$, in which A is one or not more than two kinds of elements selected among a group of alkaline-earth metals and Pb and B is one or not more than two kinds of elements selected among a group of Ti, Zr, and Sn; a composite oxide b expressed by the chemical formula, $ABO_3$, in which A is one or at least two kinds of elements of alkaline-earth metals and B is Nb and/or Ta; or a solid solution of the composite oxide a and the composite oxide b.

An invention according to claim 3 provides the piezoelectric element according to claim 1 or 2, in which an oxide forming the oxide layer is a ferroelectric material.

An invention according to claim 4 provides the piezoelectric element according to any of claims 1 to 3, in which the oxide layer contains not more than 5 weight percent of Pb.

An invention according to claim 5 provides the piezoelectric element according to any of claims 1 to 4, in which the piezoelectric film is formed of PZT expressed by a chemical formula, Pb $(Zr_{1-x}Ti_x)O_3$ $(0.1 \leq x \leq 1)$ or formed of a material mainly composed of PZT.

An invention according to claim 7 provides the piezoelectric element according to claim 1, in which the oxide layer is 0.05 µm to 1 µm in thickness.

An invention according to claim 8 provides the piezoelectric element according to claim 1, in which the piezoelectric film is 1 µm to 25 µin thickness.

An invention according to claim 9 provides the piezoelectric element according to claim 1, in which the oxide layer is not more than 10% of the piezoelectric film in thickness.

In the piezoelectric element according to claim 1 or 2, the piezoelectric film is provided with an oxide layer which does not contain lead or an oxide layer which contains a small amount of lead, and the oxide layer is arranged on a face of the piezoelectric film, the face being in contact with the electrode. Consequently, the leakage current is decreased as compared with a piezoelectric element which is not provided with an oxide layer. It is possible to form the oxide layer by forming a film on the piezoelectric film or on the electrode, and therefore process control in the production of the piezoelectric element is relatively easy.

In the piezoelectric element according to claim 1, mechanical durability of the element is more improved, and the element is effectively prevented from breakdown or the like due to peeling of the piezoelectric element and the electrode. This is probably because, as a result of employing the oxide layer being formed of a composite oxide expressed by a chemical formula $ABO_3$ or of a solid solution of one or not less than two kinds of composite oxides respectively expressed by the chemical formula $ABO_3$, a superior lattice matching is obtained between the oxide layer and the piezoelectric film and electrodes. In the piezoelectric element according to claim 2, a furthermore improved mechanical durability of the element is achieved. This is probably because the lattice matching is improved all the more between the oxide layer and the piezoelectric film and electrodes. In addition, in each piezoelectric element according to claims 1 and 2, mechanical durability of the element is more improved.

In the piezoelectric element according to claim 3, the piezoelectric film is provided with an oxide layer which is ferroelectric, and the oxide layer is arranged on a face of the piezoelectric film, the face being in contact with the electrode. As a result, it is possible to lower driving voltage of the piezoelectric element.

In the piezoelectric element according to claim 4, leakage current is decreased more and, as a result, superior piezoelectric characteristics are performed.

In the piezoelectric element according to claim 7, it is possible to securely obtain the advantage of decreasing the leakage current because the oxide layer is not less than 0.05 µm in thickness, and performance as a piezoelectric element is not deteriorated because the oxide layer is not more than 1 µm in thickness.

In the piezoelectric element according to claim 8, the piezoelectric film is 1 µm to 25 µm in thickness. As a result, there is no problem that effective vibration is not achieved by the element due to excessively thin piezoelectric film and deficient driving force and that a large driving voltage is required for displacement of the element due to excessively thick piezoelectric film.

In the piezoelectric element according to claim 9, the oxide layer is not more than 10% of the piezoelectric film in thickness, and therefore the piezoelectric characteristics to serve as a piezoelectric element are not deteriorated. When the oxide layer is excessively thick, ratio of the piezoelectric film to the whole piezoelectric element is smaller, and this cause deterioration in characteristics of the piezoelectric element such as increase in driving voltage otherwise decrease in displacement amplitude of the element. However, such deterioration does not occur when the oxide layer is not more 10% of the piezoelectric film in thickness.

DESCRIPTION OF THE PREFERRED EMBODIMENTS

Several preferred embodiments of the invention are hereinafter described with reference to FIG. 1 and FIG. 2.

Figure 1:
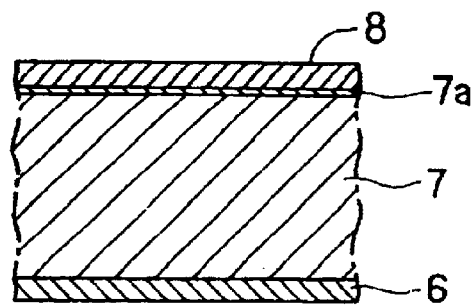
FIG. 1 shows an embodiment according to the present invention and is a partially enlarged sectional view of a piezoelectric element.
Figure 2:
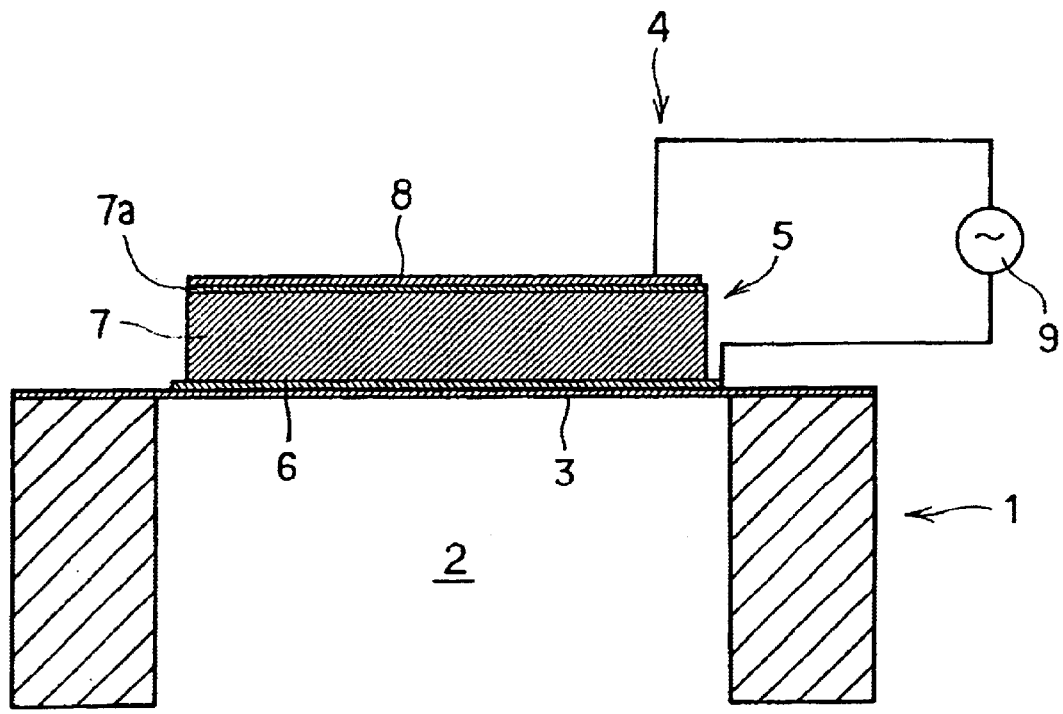
FIG. 2 is a vertical sectional view of an ink-jet printer head in which the piezoelectric element shown in FIG. 1 is used as an actuator, and a part of the ink-jet printer head is enlargedly and schematically shown.

FIG. 1 and FIG. 2 show a preferable example of the embodiments in the invention. FIG. 1 is a partially enlarged sectional view of a piezoelectric element, and FIG. 2 is a vertical sectional view of an ink-jet printer head in which the piezoelectric element is used as an actuator, and a part of the ink-jet printer head in a flexible mode is enlargedly and schematically shown. Fundamental construction of the printer head is the same as that in the prior, and the printer head is comprised of a head base 1, a diaphragm 3, and an actuator 4. The head base 1 is provided with a large number ink nozzles (not shown in the drawings) for jetting ink, a large number of ink passages (not shown in the drawings) separately communicating to the respective ink nozzles, and a large number of ink chambers 2 separately communicating to the respective ink passages. The diaphragm 3 is mounted so as to cover the whole upper face of the head base 1, and the diaphragm 3 closes upper face openings of all the ink chambers 2 of the head base 1. On the diaphragm 3, piezoelectric elements 5 for giving vibration driving force to the diaphragm 3 are mounted and formed on positions separately corresponding to the respective ink chambers 2. A power source 9 of the actuator 4 provided with the many piezoelectric elements 5 is controlled, and voltage is applied to a desired and selected piezoelectric element 5, whereby the piezoelectric element 5 is displaced and the part of the diaphragm 3 is vibrated. As a result, capacity of an ink chamber 2 located at the part corresponding to the vibration of the diaphragm 3 is changed, and ink is pushed out from the jet nozzle through the ink passage and printing is conducted.

Each of the piezoelectric elements 5 is constructed by forming a piezoelectric film 7 on a surface of a lower electrode 6 and forming an upper electrode 8 on the piezoelectric film 7 so as to sandwich the piezoelectric film 7 between the lower electrode 6 and the upper electrode 8. The material of the lower electrode 6 is not particularly limited as long as the material is normally used in the piezoelectric element. For example, platinum (Pt) and aurum (Au) are used as the material. The material of the upper electrode 8 is not particularly limited, either, as long as the material is normally used in the piezoelectric element. For example, Au, Pt, and so on are used as the material. These electrodes 6, 8 are, for example, approximately 0.05 $\mu$m to 15 $\mu$m in thickness, however, the thickness thereof is not limited in particular. It is also preferable to arrange a close content layer, which is made of, for example, Ti, between the lower electrode 6 and the piezoelectric film 7 and/or between the piezoelectric film 7 and the upper electrode 8.

The piezoelectric film 7 is not particularly limited, but is preferably made of PZT expressed by a chemical formula, $Pb(Zr_{1-x}Ti_x)O_3$ ($0.1 \leq x \leq 1$, preferably $0.4 \leq x \leq 0.9$, more preferably $0.5 \leq x \leq 0.6$) (it includes a case where x=1 in the mentioned chemical formula, i.e., $PbTiO_3$) or made of a material mainly composed of PZT. The piezoelectric film 7 having a composition of x<0.1 is not practical because the piezoelectric constant is excessively small. PZT forming the piezoelectric film 7 can be not only a simple PZT composition, but also be solid solutions with respect to valence guarantee type compositions, solid solutions of a composite oxide expressed by a chemical formula, aPZT-bPCD-cBSTO ($a+b+c=1, 0.6 \leq a \leq 1, 0 \leq b \leq 0.4, 0 \leq c \leq 0.06$), i.e., solid solutions of PZT and $BaTiO_3$ or $SrTiO_3$, solid solutions of PZT and PCD, or solid solutions of PZT, PCD and BSTO. These materials are hereinafter described as example.

The piezoelectric film 7 is approximately 1 $\mu$to 25 $\mu$m in thickness. Note that intensity of the driving force of the piezoelectric film 7 is influenced by bulk of the piezoelectric element. When the piezoelectric film 7 is excessively thin, the driving force is not sufficient to obtain an effective vibration to serve as the piezoelectric element 5, and when the piezoelectric film 7 is excessively thick, a large voltage is required in order to displace the piezoelectric element 5. However, when the piezoelectric film 7 is approximately 1 $\mu$m to 25 $\mu$m in thickness, preferably 2 $\mu$m to 12 $\mu$m in thickness, an effective vibration to serve as the piezoelectric element 5 is obtained and the piezoelectric element 5 is displaced without requiring any large voltage.

The piezoelectric film 7 is provided with an oxide layer (hereinafter referred to as "upper layer") 7a which does not contain Pb otherwise contains not more than 15 weight percent, preferably not more than 5 weight percent, of Pb which is arranged on a face of the piezoelectric film 7, the face being in contact with the upper electrode 8. It is also preferable that the piezoelectric film 7 is provided with an oxide layer which contains 0 or not more than 15 weight percent (preferably not more than 5 weight percent) of Pb which is arranged on a face of the piezoelectric film 7, the face being in contact with the lower electrode 6. It is also preferable that the piezoelectric film 7 is provided with oxide layers which contain 0 or not more than 15 weight percent (preferably not more than 5 weight percent) of Pb respectively arranged on a face of the piezoelectric film 7, the face being in contact with the upper electrode 8, and a face of the piezoelectric film 7, the face being in contact with the lower electrode 6. Moreover, it is also preferable that the piezoelectric film 7 is provided with an oxide layer which contains 0 or not more than 15 weight percent (preferably not more than 5 weight percent) of Pb which is arranged in the middle of the piezoelectric film 7. Described hereinafter is a case where the piezoelectric film 7 is provided with the upper layer 7a.

The upper layer 7a is formed of a composite oxide expressed by a chemical formula, $ABO_3$ or a solid solution of at least two kinds of composite oxides. In the chemical formula, A is one or at least two kinds of elements selected among a group of alkaline-earth metals and Pb, and B is one or at least two kinds of elements selected among a group of Ti, Zr, and Sn. Alternatively, in the foregoing chemical formula, A is one or at least two kinds of elements of alkaline-earth metals, and B is at least one of Nb and Ta. It is also preferable that the upper layer 7a is formed of a solid solution of these composite oxides. In a specific example of the upper layer 7a, the upper layer 7a is formed of BSTZ expressed by a chemical formula, $(Ba_{1-y}Sr_y)Ti_{1-z}Zr_z)O_3$ ($0 \leq y \leq 1, 0 \leq z \leq 1$) (it includes a case where y=0 and z=0 in the foregoing chemical formula, i.e., $BaTiO_3$; a case where y=0 and z=1 in the foregoing chemical formula, i.e., $BaZrO_3$; a case where y=1 and z=0 in the foregoing chemical formula, i.e., $SrTiO_3$; and a case where y=1 and z=1 in the foregoing chemical formula, i.e., $SrZrO_3$) or formed of a material mainly composed of BSTZ. The oxide forming the upper layer 7a is a ferroelectric material or a high dielectric material.

The upper layer 7a is 0.05 $\mu$m to 1 $\mu$m in thickness. When the upper layer 7a is excessively thin, the advantage of decreasing the leakage current described later is not achieved. On the other hand, when the upper layer 7a is excessively thick, performance to serve as the piezoelectric element 5 is deteriorated. However, by arranging the upper layer 7a to be 0.05 $\mu$m to 1 $\mu$m in thickness, it is possible to securely achieve the advantage of decreasing the leakage current and preventing the deterioration in performance rendered the piezoelectric element 5.

The upper layer 7a is not more than 10% of the piezoelectric film 7 in thickness. When the upper layer 7a is excessively thick as compared with the thickness of the piezoelectric film 7, the ratio of the piezoelectric film 7 to the whole piezoelectric element 5 is lowered, and this causes deterioration in characteristics of the piezoelectric element 5 such as increase in driving voltage and decrease in displacement amplitude of the element. However, piezoelectric characteristics to serve as the piezoelectric element 5 are not deteriorated by arranging the upper layer 7a to be not more than 10%, preferably not more than 5%, of the piezoelectric film 7 in thickness.

In the piezoelectric element 5 having a constitution as described above, the whole surface of the piezoelectric film 7 is coated with the upper layer 7a which does not contain Pb or contains just a small amount of Pb, and consequently, the leakage current is decreased as compared with a piezoelectric element which is not provided with the upper layer 7a. The upper layer 7a is formed of a ferroelectric material or a high dielectric material, and therefore the lowered driving voltage of the piezoelectric element 5 is restrained to be low. It is possible to form the upper layer 7a by forming a film 7 on the piezoelectric film or on the electrode, and therefore process control in the production of the piezoelectric element is relatively easy.

The piezoelectric film 7 and the upper layer 7a are formed by using a method of applying paste (thick film method), sol-gel method, sputtering method, vacuum deposition method, CVD method, laser ablation method, and so on. In the method in which the piezoelectric film 7 is formed by using paste applying method or sol-gel method, a composition containing PZT and/or a precursor of the PZT is used, and these compositions are applied onto the lower electrode over and over to form the piezoelectric film. The composition containing PZT and/or a precursor of the PZT is, more specifically, a PZT powder, a PZT precursor powder (for example, a mixture of $(Zr_{1-x}Ti_x)_2O_4$ powder and PbO powder), a moisture of PZT precursor powder and a solution (for example, a mixture of PbO powder and a solution containing each alkoxide of Zr and Ti or a material produced by hydrolyzing and polymerizing them), a PZT precursor solution (each alkoxide of Zr, Ti, and Pb or metallic salts or a material produced by hydrolyzing and polymerizing them), a mixture of PZT powder and PZT precursor powder, a mixture of PZT powder, a PZT precursor powder, and a solution, or a mixture of PZT powder and PZT precursor solution. Examples of the method using piezoelectric paste applying method and sol-gel method are hereinafter described in more detail.

In the method of forming the piezoelectric film 7 by using paste, first, a paste containing a precursor composition of PZT is prepared. This paste is prepared by adding a PZT powder of a predetermined composition and an organic binder to a solvent. The PZT powder is produced by any of publicly-known methods such as solid phase reaction of the powder used as a raw material, hydrolyzation method using metallic alkoxide or metallic salt as a starting material, coprecipation method, hydrothermal method, and spray decomposition method. The PZT powder is not more than 0.5 $\mu$m, preferably not more than 0.2 $\mu$m, in particle size. The material used as the organic binder is, for example, hydroxyethylcellulose, hydroxypropylcellulose, polyvinyl alcohol, nylon, and a homopolymer or a copolymer of (meth)acrylic acid. The solvent is used in order to improve workability in applying the paste, and is suitably selected from various kinds of solvents. For example, ethylcellosolve is used as the solvent. PZT is superior in dispersibility even when it is blended in high concentration to the paste.

After obtaining the paste containing a precursor composition of PZT is obtained, the paste is applied onto the lower electrode formed by screen printing method or the like on a substrate of zirconia or the like, and the solvent is removed by drying each time the paste is applied if necessary, and the paste is applied over and over to form plural layers. The method for applying the paste is, for example, a common coating method such as screen printing method, spin coating method, dipping method, cast method, and doctor blade method, but the method is not particularly limited. After completing a series of paste applying process, the precursor composition of PZT is burnt. Burning is conducted at an appropriate temperature, for example, at 300° C. to 1,400° C., and preferably at 600° C. to 1,200° C. The burning is conducted under any atmosphere such as inert-gas atmosphere, oxygen-contained atmosphere (in the air or the like), and PbO atmosphere, and it is possible to conduct the burning under either normal pressure or reduced pressure. The burning is normally conducted by raising the temperature from room temperature to approximately 300° C. to 1,400° C. for 2 hours to 24 hours in the air. It is also preferable to raise the temperature stepwise. Almost all of the organic components disappears due to the burning as described above, and the piezoelectric film of minute and compact structure is obtained. After forming the piezoelectric film on the lower electrode, the upper layer is formed on the surface of the piezoelectric film by using, for example, sol-gel method described later, the upper electrode is formed on the upper layer by a normal method such as sputtering method and deposition method, and thus the piezoelectric element is prepared.

It is also preferable that after forming a film using the paste which contains a precursor composition of PZT, the film is burnt to form the piezoelectric film, then a film of a precursor composition of BSTZ is formed on the surface of the piezoelectric film using a method such as sol-gel method, and the PZT film is burnt again together with the burning of the BSTZ film. It is also preferable that after forming a film using the paste which contains a precursor composition of PZT, a film of a precursor composition of BSTZ is formed on the surface of the obtained PZT film using a method such as sol-gel method, then the PZT film and the BSTZ film are burnt to form the piezoelectric film and the upper layer.

In the step of burning the PZT film again together with the burning of the BSTZ film, or in the step of burning the PZT film and the BSTZ film, it is considered that material components of the piezoelectric film and material components of the upper layer actually transfer between the two films due to thermal diffusion, and Pb component is diffused into the upper layer in some cases. However, diffusion of Pb component into the upper layer does not reduce the mentioned advantages of the upper layer.

Then, in the method of forming a piezoelectric film 7 using sol-gel method, first, a solution (precursor sol) which contains a precursor composition of PZT is prepared. This solution is prepared by using, for example, each alkoxide of lead, titanium, and zirconium and/or salt as starting materials and hydrolyzing and polymerizing a solution containing these raw materials. In the method of forming the upper layer 7a using sol-gel method, a solution (precursor sol) which contains a precursor composition of BSTZ is prepared. This solution is prepared by using, for example, each alkoxide of barium, strontium, titanium, and zirconium and/or salts as starting materials and hydrolyzing and polymerizing a solution containing these raw materials. The metallic alkoxide is not particularly limited, but it is preferable to use alkoxyl in which number of carbons is 1 to 15, and it is more preferable to use alkoxyl in which number of carbons is 1 to 4. Acetate, oxalate, nitrate, chloride, and so on are used as metallic salt.

Single solvent or mixed solvent can be used as the solvent for dissolving metallic alkoxide and/or metallic salts on condition that the starting material and water used for hydrolyzation are soluble. The solvent is not particularly limited, and it is possible to use, for example, a combination of polar solvent and nonpolar solvent. Alcohol or amide is used in view of viscosity in the temperature range of adding water and easiness in removing the solvent. Nonpolar solvent such as toluene and hydrocarbon can be used jointly. For example, first-class alcohol such as methanol, ethanol, propanol, and butanol, second-class alcohol such as ethylene glycol and propylene alcohol, and alkoxy alcohol such as 2-methoxyethanol, 2-ethoxyethanol, 2-butoxyethanol, and 1-methoxy-2-propanol of which number of carbons is 1 to 5 are used as alcohol. Formamide, N,N-dimethylformamide (DMF), or the like is used as acid amide. Other than them, it is also possible to use aromatic compound such as toluene, hydrocarbon such as hexane or cyclohexane, ester such as methyl acetate or ethyl acetate, and acetonitrile.

It is also preferable to add, for example, alkanolamine such as monoethanolamine, diethanolamine, triethanolamine and/or β-diketone such as acetylacetone, methyl acetoacetate, ethyl acetoacetate to the solution which contains metallic alkoxide and/or metallic salt in order to improve stability of the solution.

In hydrolyzing the solution which contains metallic alkoxide and/or metallic salt, for example, 0.05 mole to 2 mole of water is added to 1 mole of metallic alkoxide and/or metallic salt, and preferably 0.5 mole to 1.5 mole of water is added to 1 mole of metallic alkoxide and/or metallic salt. It is also preferable to use an acid catalyst and/or a base catalyst in the hydrolyzation, and it is more preferable to use mineral acid such as hydrochloric acid or organic acid such as acetic acid.

After preparing the solution containing a precursor composition of PZT by hydrolyzing the solution containing metallic alkoxide and/or metallic salt, the solution is applied onto the surface of the lower electrode, dried, and burnt, and the piezoelectric film is formed on the lower electrode. In this process, the solution containing a precursor composition of PZT is applied onto the lower electrode by repeating the respective steps of forming a film, drying, and preliminary (intermediate) burning for a necessary number of times so as to obtain the piezoelectric film of a predetermined thickness, and the PZT film is finally burnt.

After preparing the solution containing a precursor composition of BSTZ by hydrolyzing the solution which contains metallic alkoxide and/or metallic salt, the solution is applied onto the surface of the piezoelectric film, dried, and burnt, and the upper layer is formed on the piezoelectric film.

The method is not particularly limited, but spin coating method is normally used as the method of applying the solutions. The temperature of the preliminary (intermediate) burning is, for example, approximately 300° C. to 400° C., and the temperature of the burning finally conducted is, for example, approximately 800° C. to 1000° C. After forming the piezoelectric film on the lower electrode and forming the upper layer on the piezoelectric film, then the upper electrode is formed on the upper layer by a normal method, and thus a piezoelectric element is prepared.

It is also preferable that after the solution containing a precursor composition of PZT is applied on the surface of the lower electrode, dried, and burnt preliminarily if necessary, the PZT film is burnt to form the piezoelectric film, the solution containing a precursor composition of BSTZ is applied on the surface of the piezoelectric film, dried, and burnt preliminarily if necessary, and then the PZT film is burnt again together with burning of the BSTZ film. It is also preferable that after the solution containing a precursor composition of PZT is applied on the surface of the lower electrode, dried, and burnt preliminarily if necessary, the solution containing a precursor composition of BSTZ is applied onto the surface of the obtained PZT film, dried, and burnt preliminarily if necessary, and then the PZT film and the BSTZ film are burnt to form a piezoelectric film and an upper layer.

Elementary analysis in the piezoelectric film and the upper layer is conducted by using x-ray microanalysis (EPMA) when the film is approximately 10 $\mu$m in thickness and using x-ray optoelectronic spectral analysis (ESCA), secondary ion mass analysis (SIMS), and Auger analysis (AES) when the film is not more than several $\mu$m in thickness. (The upper layer is normally not more than 1 $\mu$m in thickness.) Space resolution is preferably conducted by using energy-dispersive x-ray microanalysis (EDX) mounted with a transmission-type electron microscope (TEM). However, it is not possible to separate Ba and Ti in this case.

EXAMPLES

Described hereinafter are more specific embodiments to which the invention is applied.

(Preparation of piezoelectric paste)

A PZT powder was prepared by the steps of mixing $(Zr_{0.52}Ti_{0.48})_2O_4$ powder (produced by Sakai Chemical Industry Co., Ltd.) and PbO powder (produced by Kohjundo Chemical) with methanol as a medium using a ball mill, burning the mixture at a temperature of 650° C. for 2 hours, and grinding the obtained burnt material by means of a zirconia ball in methanol for 16 hours in the ball mill. The average particle size of the obtained PZT powder was 0.2 $\mu$m. A PZT powder, in which $La_2O_3$ or $Nb_2O_5$ was added, was prepared by adding oxide material of $La_2O_3$ (produced by Kohjundo Chemical) or $Nb_2O_5$ (produced by Taki Chemical) to $(Zr_{0.52}Ti_{0.48})_2O_4$ powder (produced by Sakai Chemical Industry Co., Ltd.) and PbO powder (produced by Kohjundo Chemical) and using the same method as described above. The average particle size of the obtained powder was 0.2 $\mu$m.

A composite perovskite powder was prepared by mixing $MgNb_2O_6$ powder, $ZnNb_2O_6$ powder or $MgTa_2O_6$ powder, $(Zr_{0.4}Ti_{0.6})_2O_4$ powder, PbO powder, strontium titanate (produced by Sakai Chemical Industry Co., Ltd.), and barium titanate (produced by Sakai Chemical Industry Co., Ltd.) each in a predetermined amount using methanol as a medium by means of a ball mill, burning the mixture at a temperature of 800° C. for 2 hours, and grinding the obtained burnt material by means of zirconia balls in methanol for 24 hours in the ball mill. The average particle size of the obtained powder was 0.2 $\mu$m.

Piezoelectric Pastes 1 to 10 were prepared by adding 100 weight parts of the obtained PZT powder, PZT powder in which $La_2O_3$ or $Nb_2O_5$ was added, or composite perovskite powder and 9 weight parts of hydroxypropyl cellulose (produced by Nippon Soda Co., Ltd., HPC-L) to eight weight parts of ethylcellosolve and kneading them by means of a three-roll mixer.

Paste 1: $Pb(Zr_{0.52}Ti_{0.48})O_3$
Paste 2: $0.02La_2O_3$—$0.98Pb(Zr_{0.52}Ti_{0.48})O_3$
Paste 3: $0.02Nb_2O_5$—$0.98Pb(Zr_{0.52}Ti_{0.48})O_3$
Paste 4: $0.35Pb(Mg_{1/3}Nb_{2/3})O_3$—$0.65Pb(Zr_{0.4}Ti_{0.6})O_3$
Paste 5: $0.35Pb(Mg_{1/3}Nb_{2/3})O_3$—$0.62Pb(Zr_{0.4}Ti_{0.6})O_3$—$0.03SrTiO_3$
Paste 6: $0.35Pb(Mg_{1/3}Nb_{2/3})O_3$—$0.62Pb(Zr_{0.4}Ti_{0.6})O_3$—$0.03BaTiO_3$
Paste 7: $0.35Pb(Zn_{1/3}Nb_{2/3})O_3$—$0.65Pb(Zr_{0.4}Ti_{0.6})O_3$
Paste 8: $0.35Pb(Zn_{1/3}Nb_{2/3})O_3$—$0.62Pb(Zr_{0.4}Ti_{0.6})O_3$—$0.03SrTiO_3$
Paste 9: $0.35Pb(Mg_{1/3}Ta_{2/3})O_3$—$0.65Pb(Zr_{0.4}Ti_{0.6})O_3$
Paste 10: $0.35Pb(Mg_{1/3}Ta_{2/3})O_3$—$0.62Pb(Zr_{0.4}Ti_{0.6})O_3$—$0.03SrTiO_3$ (Preparation of upper layer forming solution)

Tetra-i-propoxytitanium, tetra-n-butoxy-zirconium, metallic barium or diethoxybarium, metallic strontium or diethoxystrontium, and lead acetate were used as starting materials of the respective constitution elements.

Each starting material corresponding to the composition of each upper layer forming solution was added to 2-methoxyethanol and heated at a temperature of 120° C. for 6 hours. A brown homogeneous solution was thus obtained. 0.1M hydrochloric acid diluted with 2-methoxyethanol was dropped into the obtained solution. Amount of the added water was equal to the mole amount of alkoxide to be used. Solution were prepared so that the oxide concentration of the upper layer forming solution may be 3 weight percent.

Upper Layer Forming Solution 1: $BaTiO_3$
Upper Layer Forming Solution 2: $(Ba_{0.7}Sr_{0.3})TiO_3$
Upper Layer Forming Solution 3: $SrTiO_3$
Upper Layer Forming Solution 4: $Ba(Ti_{0.8}Sr_{0.2})O_3$
Upper Layer Forming Solution 5: $BaZrO_3$
Upper Layer Forming Solution 6: $SrZrO_3$
Upper Layer forming Solution 7: $(Ba_{0.95}Pb_{0.05})TiO_3$
Upper Layer Forming Solution 8: $(Ba_{0.85}Pb_{0.15})TiO_3$
Upper Layer Forming Solution 9: $(Ba_{0.75}Pb_{0.25})TiO_3$ Examples 1 to 17
(Piezoelectric Element Forming Method 1)

In order to make a piezoelectric element for an ink-jet printer head of a construction as shown in FIG. 2, a Pt paste was screen printed on a zirconia substrate of 10 μm in thickness to serve as a diaphragm, so as to be 10 μm in thickness serving as the lower electrode after burning. Then, a multilayer film in which each kind of paste is screen printed so that the piezoelectric film may be 200 μm×3 mm in size and 10 μm in thickness was prepared. The upper layer was formed on the multilayer film using the upper layer forming solutions. After burning the obtained film at a predetermined temperature for 5 hours under PbO atmosphere, an Au film was formed by sputtering method to serve as the upper electrode, and thus a piezoelectric element was prepared.

(Piezoelectric Element Forming Method 2)

In order to make a piezoelectric element for an ink-jet printer head of a construction as shown in FIG. 2, a Pt paste was screen printed on a zirconia substrate of 10 μm in thickness to serve as a diaphragm, so as to be 10 μm in thickness as the lower electrode after burning. Then, a multilayer film in which each kind of paste is screen printed so that the piezoelectric film may be 200 μm×3 mm in size and 10 m in thickness was prepared. After burning the obtained multilayer film at a predetermined temperature for 5 hours under PbO atmosphere, the upper layer was formed using the upper layer forming solutions. After heating the obtained film at a temperature of 700° C. for 15 minutes, an Au film was formed by sputtering method to serve as the upper electrode, and thus a piezoelectric element was prepared.

Figure 3:
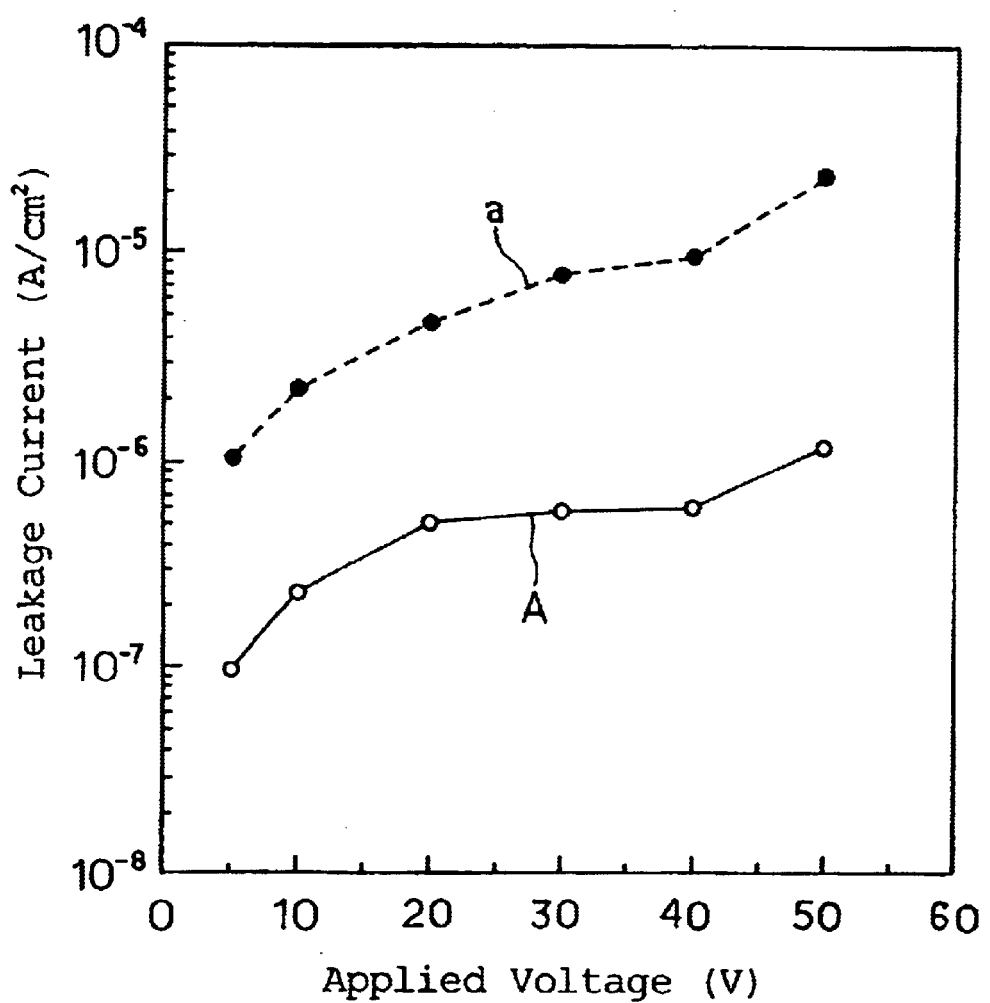
FIG. 3 is a view showing I-V characteristics of each of the piezoelectric element obtained in Example 3 and that obtained in Comparative Example 1.

The obtained piezoelectric element was evaluated by measuring amplitude of the element at the time of applying an electric field of 30V was applied using a Tencor measuring instrument. I-V characteristics were measured in order to evaluate leakage characteristic of the piezoelectric element at the time of applying an electric field of 30V. The paste composition, upper layer forming solution composition, element forming method, burning temperature, and evaluation results are collectively shown in Table 1. I-V characteristics of the piezoelectric element obtained in the foregoing Example 3 are indicated by the solid line A in FIG. 3.

TABLE 1

| | Paste Composition | Upper Layer Forming Solution Composition | Element Forming Method | Upper Layer Film Thickness (μm) | Burning Temperature (° C.) | Amplitude (μm) | Leakage Current (A/Cm²) |
|---|---|---|---|---|---|---|---|
| Example 1 | 1 | 1 | 1 | 0.8 | 1050 | 0.20 | $6.7 \times 10^{-7}$ |
| Example 2 | 2 | 1 | 1 | 0.8 | 1050 | 0.21 | $6.4 \times 10^{-7}$ |
| Example 3 | 3 | 1 | 1 | 0.8 | 1050 | 0.21 | $5.9 \times 10^{-7}$ |
| Example 4 | 3 | 1 | 2 | 0.8 | 1050 | 0.22 | $6.0 \times 10^{-7}$ |
| Example 5 | 3 | 2 | 1 | 0.8 | 1070 | 0.21 | $6.1 \times 10^{-7}$ |
| Example 6 | 3 | 3 | 1 | 0.8 | 1070 | 0.20 | $5.9 \times 10^{-7}$ |
| Example 7 | 3 | 4 | 1 | 0.8 | 1050 | 0.20 | $5.9 \times 10^{-7}$ |
| Example 8 | 3 | 5 | 1 | 0.8 | 1050 | 0.21 | $6.0 \times 10^{-7}$ |
| Example 9 | 3 | 6 | 1 | 0.8 | 1050 | 0.20 | $5.9 \times 10^{-7}$ |
| Example 10 | 4 | 1 | 1 | 0.8 | 950 | 0.23 | $5.4 \times 10^{-7}$ |
| Example 11 | 5 | 1 | 1 | 0.8 | 1000 | 0.24 | $5.1 \times 10^{-7}$ |
| Example 12 | 5 | 3 | 1 | 0.8 | 1000 | 0.23 | $4.9 \times 10^{-7}$ |
| Example 13 | 6 | 1 | 1 | 0.8 | 1000 | 0.24 | $4.9 \times 10^{-7}$ |
| Example 14 | 7 | 1 | 1 | 0.8 | 950 | 0.22 | $5.7 \times 10^{-7}$ |
| Example 15 | 8 | 1 | 1 | 0.8 | 1000 | 0.23 | $4.9 \times 10^{-7}$ |
| Example 16 | 9 | 1 | 1 | 0.8 | 950 | 0.22 | $5.8 \times 10^{-7}$ |
| Example 17 | 10 | 1 | 1 | 0.8 | 1000 | 0.25 | $4.8 \times 10^{-7}$ |
| Example 18 | 3 | 7 | 1 | 0.8 | 1050 | 0.20 | $3.0 \times 10^{-7}$ |
| Example 19 | 3 | 8 | 1 | 0.8 | 1050 | 0.20 | $7.5 \times 10^{-7}$ |
| Example 20 | 3 | 1 | 1 | 1.6 | 1050 | 0.32 | $4.8 \times 10^{-7}$ |
| Comparative Example 1 | 3 | | | | 1050 | 0.20 | $7.5 \times 10^{-6}$ |
| Comparative Example 2 | 5 | | | | 1000 | 0.23 | $6.8 \times 10^{-6}$ |
| Comparative Example 3 | 3 | 9 | 1 | 0.8 | 1050 | 0.20 | $5.4 \times 10^{-6}$ |

Example 18

A piezoelectric element was prepared using the Upper Layer Forming Solution 7 by the foregoing Piezoelectric Element Forming Method 2. For the obtained piezoelectric element, amplitude of the element at the time of applying an electric field of 30V was measured, and I-V characteristics were measured in order to evaluate leakage characteristic at the time of applying an electric field of 30V. Before forming the upper electrode, EPMA analysis was conducted from the surface on the upper side. As a result, Ba, Ti, and Pb were detected from the outermost surface portion on the upper side, and content of Pb was 5 weight percent. This proves that a layer containing less Pb is formed on the outermost surface portion on the upper side of the piezoelectric film. The paste composition, upper layer forming solution composition, element forming method, burning temperature, and evaluation results are shown in Table 1.

Example 19

Preparation and evaluation of the piezoelectric element were conducted in the same manner as in the foregoing Example 18 using Upper Layer Forming Solution 8. Before forming the upper electrode, EPMA analysis was conducted from the surface on the upper side. As a result, Ba, Ti, and Pb were detected from the outermost surface portion on the upper side, and content of Pb was 10 weight percent. This proves that a layer containing less Pb is formed on the outermost surface portion on the upper side of the piezoelectric film. The paste composition, upper layer forming solution composition, element forming method, burning temperature, and evaluation results are shown in Table 1.

Example 20

A piezoelectric element was prepared by Element Forming Method 1 so that the whole piezoelectric film may be 20 μm in thickness and the upper layer may be 1.6 μm in thickness.

The amplitude of the element at the time of applying an electric field of 40V was measured and I-V characteristics were measured in order to evaluate leakage characteristic of the piezoelectric element at the time of applying an electric field of 40V. The paste composition, upper layer forming solution composition, element forming method, burning temperature, and evaluation results in this example are shown in Table 1. Before forming the upper electrode, EPMA analysis was conducted from the surface on the upper side. As a result, only Ba and Ti were detected from the outermost surface portion on the upper side, and Pb component was not detected. The weight ratio of Ba to Ti proves that a $BaTiO_3$ layer where Pb does not exist is formed on the outermost surface portion on the upper side of the piezoelectric film.

Comparative Examples 1 and 2

Figure 5:
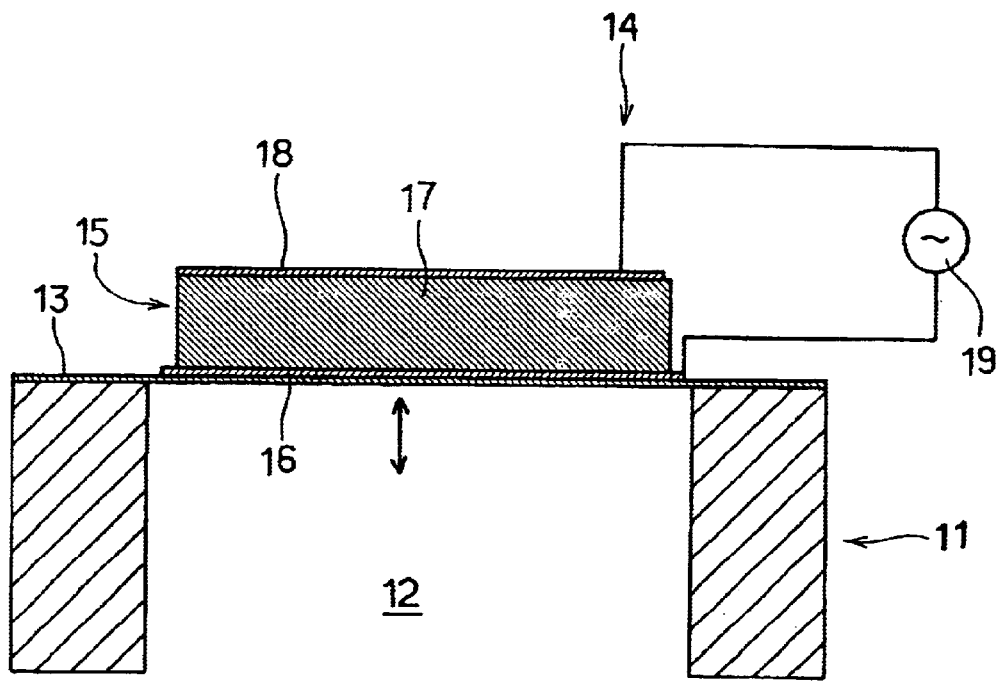
FIG. 5 is a vertical sectional view of an ink-jet printer head in which a conventional piezoelectric element is used as in actuator, and a part of the ink-jet printer head is enlargedly and schematically shown.

Piezoelectric elements composed as shown in FIG. 5 were prepared using Paste 3 and Paste 5 respectively by the same method as in the foregoing Example 1. For each of the obtained piezoelectric elements, amplitude of the element at the time of applying an electric field of 30V was measured, and I-V characteristics were measured in order to evaluate leakage characteristic of the piezoelectric element at the time of applying an electric field of 30V. The paste composition, element forming method, burning temperature, and evaluation results in this case are shown in Table 1. I-V characteristics of the piezoelectric element obtained in Comparative Example 1 are indicated by the broken line a in FIG. 3.

Comparative Example 3

Preparation and evaluation of the piezoelectric element were conducted in the same manner as in the foregoing Example 18 using Upper Layer Forming Solution 9. Before forming the upper electrode, EPMA analysis was conducted from the surface on the upper side. As a result, Ba, Ti, and Pb were detected from the outermost surface portion on the upper side, and content of Pb was 17 weight percent. The paste composition, upper layer forming solution composition, element forming method, burning temperature, and evaluation results are shown in Table 1.

In the piezoelectric element according to the mentioned examples of the invention, the amplitude is approximately 0.2 μm to 0.25 μm when voltage of 30V is applied. Amplitude is almost the same as in the comparative examples, but when comparing the examples and the comparative examples of the same composition (Examples 3 to 9 and Comparative Example 1, Example 12 and Comparative Example 2), leakage current at the time of applying a voltage of 30V is smaller in the examples than that in the comparative example. This proves that I-V characteristics are improved.

(Preparation of piezoelectric solution)

Dehydrated lead acetate, metallic magnesium, dehydrated zinc acetate, dehydrated nickel acetate, pentaethoxyniobium, pentaethoxytantalum, tetra-i-propoxytitanium, tetra-n-butoxy-zirconium, metallic barium or diethoxybarium, and metallic strontium or diethoxystrontium were used as starting materials of the respective constitution elements.

Each starting material was added to 2-methoxyethanol and heated at a temperature of 120° C. for 6 hours in order to obtain the same composition as the mentioned paste. A brown homogeneous solution was thus obtained. 0.1M hydrochloric acid diluted with 2-methoxyethanol was dropped into the obtained solution. Amount of the added water was equal to the mole amount of alkoxide to be used. 2-methoxyethanol solution of hydroxypropyl cellulose (HPC-L) was added as viscosity improver to the solution. Amount of the added hydroxypropyl cellulose was 10% of the inorganic composition. Solution were prepared so that the oxide concentration in the obtained solution may be 20 weight percent.

---

Solution 1: $Pb(Zr_{0.52}Ti_{0.48})O_3$
Solution 2: $0.02La_2O_3$—$0.98Pb(Zr_{0.52}Ti_{0.48})O_3$
Solution 3: $0.02Nb_2O_5$—$0.98Pb(Zr_{0.52}Ti_{0.48})O_3$
Solution 4: $0.35Pb(Mg_{1/3}Nb_{2/3})O_3$—$0.65Pb(Zr_{0.4}Ti_{0.6})O_3$
Solution 5: $0.35Pb(Mg_{1/3}Nb_{2/3})O_3$—$0.62Pb(Zr_{0.4}Ti_{0.6})O_3$—$0.03SrTiO_3$

---

Examples 21 to 35

(Piezoelectric Element Forming Method 3)

In order to make the piezoelectric element for an ink-jet printer head of a construction as shown in FIG. 2, a Ti film of 50 nm in thickness and a Pt film of 0.5 μm in thickness were formed to serve as the lower electrode by sputtering method on a zirconia substrate of 5 μm in thickness to serve as a diaphragm. After forming a film by applying the solution onto the lower electrode by spin coat method (in 1,200 r.p.m for 30 seconds), the film was dried at a temperature of 120° C. and was burnt preliminarily at a temperature of 400° C. (speed of temperature rise: 20° C./minute, kept for 15 minutes). This operation was repeated using each solution until the whole film thickness became 5 μm. After forming the upper layer using the upper layer forming solution on the obtained multilayer film, a preliminary burning was conducted at a temperature of 400° C. (speed of temperature rise: 20° C./minute, kept for 15 minutes), and a burning was conducted at a temperature of 900° C. (speed of raising the temperature: 10° C./minute, kept for 15 minutes). Patterning was conducted on the obtained piezoelectric film using a photoresist, and chemical etching was conducted, whereby the piezoelectric film was patterned to be 200 μm×3 mm in size. An Au film to serve as the upper electrode was formed by sputtering method on the obtained piezoelectric film, and thus an aimed piezoelectric element was prepared. In Example 21, qualitative analysis was conducted on the upper side using SIMS before forming the upper electrode. As a result, Pb component was not detected on the outermost surface portion on the upper side.

Example 36

A piezoelectric element was prepared by Piezoelectric Element Forming Method 3 so that the whole piezoelectric film may be 2 μm in thickness and the upper layer may be 0.05 μm in thickness.

Figure 4:
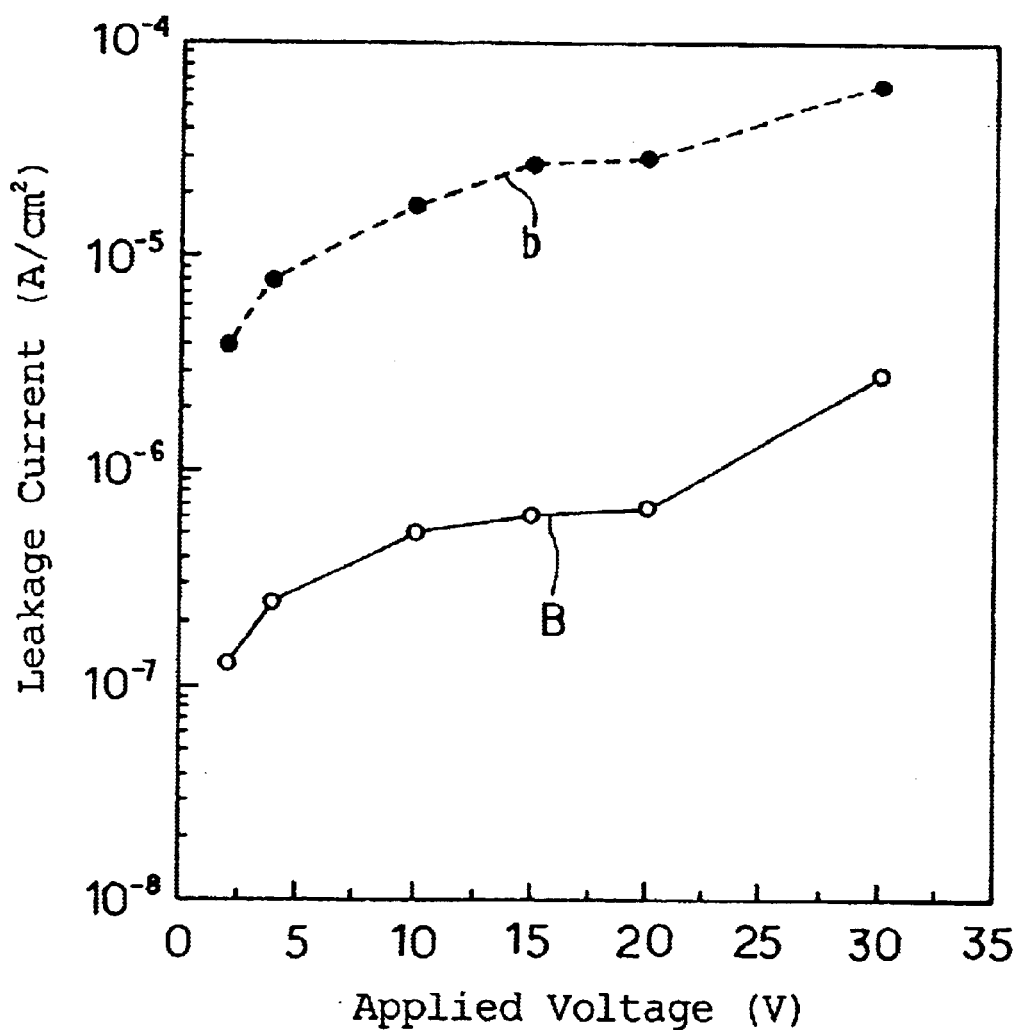
FIG. 4 is a view showing I-V characteristics of each of the piezoelectric element obtained in Example 24 and that obtained in Comparative Example 4.

The obtained piezoelectric element was evaluated by measuring amplitude of the element at the time of applying an electric field of 15V using a Tencor measuring instrument. I-V characteristics were measured in order to evaluate leakage characteristic of the piezoelectric element at the time of applying an electric field of 15V. The solution composition, upper layer forming solution composition, element forming method, and evaluation results are collectively shown in Table 2. I-V characteristics of the piezoelectric element obtained in the foregoing Example 24 are indicated by the solid line B in FIG. 4.

upper electrode, EPMA analysis was conducted from the surface on the upper side. As a result, Ba, Ti, and Pb were detected from the outermost surface portion on the upper side, and content of Pb was 9 weight percent. This proves that a layer containing less Pb is formed on the outermost surface portion on the upper side of the piezoelectric film. The solution composition, upper layer forming solution composition, element forming method, and evaluation results are shown in Table 2.

Comparative Examples 4 and 5

Piezoelectric elements of constitution as shown in FIG. 5 were prepared using Solution 3 and Solution 5 respectively by burning at a temperature of 900° C. (speed of temperature rise: 10° C./minute, kept for 15 minutes) after repeating the steps of forming the film to the preliminary (intermediate) burning until the film became 5 μm in thickness. For each of

TABLE 2

| | Paste Composition | Upper Layer Forming solution Composition | Element Forming Method | Upper Layer Film Thickness (μm) | Amplitude (μm) | Leakage Current (A/Cm$^2$) |
|---|---|---|---|---|---|---|
| Example 21 | 1 | 1 | 3 | 0.2 | 0.14 | 8.7 × 10$^{-7}$ |
| Example 22 | 2 | 1 | 3 | 0.2 | 0.13 | 5.4 × 10$^{-7}$ |
| Example 23 | 3 | 1 | 3 | 0.2 | 0.13 | 5.2 × 10$^{-7}$ |
| Example 24 | 3 | 1 | 3 | 0.1 | 0.14 | 6.2 × 10$^{-7}$ |
| Example 25 | 3 | 1 | 3 | 0.05 | 0.15 | 7.3 × 10$^{-7}$ |
| Example 26 | 3 | 2 | 3 | 0.2 | 0.13 | 5.0 × 10$^{-7}$ |
| Example 27 | 3 | 3 | 3 | 0.2 | 0.13 | 5.3 × 10$^{-7}$ |
| Example 28 | 3 | 3 | 3 | 0.1 | 0.14 | 5.2 × 10$^{-7}$ |
| Example 29 | 3 | 4 | 3 | 0.2 | 0.13 | 5.2 × 10$^{-7}$ |
| Example 30 | 3 | 5 | 3 | 0.2 | 0.12 | 5.5 × 10$^{-7}$ |
| Example 31 | 3 | 6 | 3 | 0.2 | 0.13 | 5.4 × 10$^{-4}$ |
| Example 32 | 4 | 1 | 3 | 0.2 | 0.16 | 4.5 × 10$^{-7}$ |
| Example 33 | 5 | 1 | 3 | 0.2 | 0.18 | 4.2 × 10$^{-7}$ |
| Example 34 | 5 | 3 | 3 | 0.2 | 0.17 | 4.0 × 10$^{-7}$ |
| Example 35 | 5 | 3 | 3 | 0.1 | 0.18 | 4.3 × 10$^{-7}$ |
| Example 36 | 3 | 1 | 3 | 0.05 | 0.14 | 9.1 × 10$^{-7}$ |
| Example 37 | 3 | 7 | 3 | 0.2 | 0.20 | 5.3 × 10$^{-7}$ |
| Example 38 | 3 | 8 | 3 | 0.2 | 0.20 | 1.0 × 10$^{-6}$ |
| Comparative Example 4 | 3 | | | | 0.15 | 2.8 × 10$^{-5}$ |
| Comparative Example 5 | 5 | | | | 0.18 | 9.7 × 10$^{-6}$ |
| Comparative Example 6 | 3 | 9 | 3 | 0.2 | 0.20 | 1.0 × 10$^{-5}$ |

Example 37

A piezoelectric element was prepared using Upper Layer Forming Solution 7 by the mentioned Piezoelectric Element Forming Method 3. For the obtained piezoelectric element, amplitude of the element at the time of applying an electric field of 15V was measured and I-V characteristics were measured in order to evaluate leakage characteristic at the time of applying an electric field of 15V was applied. Before forming the upper electrode, EPMA analysis was conducted from the surface on the upper side. As a result, Ba, Ti, and Pb were detected from the outermost surface portion on the upper side, and content of Pb was 4 weight percent. This proves that a layer containing less Pb is formed on the outermost surface portion on the upper side of the piezoelectric film. The solution composition, upper layer forming solution composition, element forming method, and evaluation results are shown in Table 2.

Example 38

Preparation and evaluation of the piezoelectric element were conducted in the same as in the foregoing Example 37 using Upper Layer Forming Solution 8. Before forming the the obtained piezoelectric elements, amplitude of the element at the time of applying an electric field of 15V was measured and I-V characteristics were measured in order to evaluate leakage characteristic of the piezoelectric element at the time of applying an electric field of 15V. The solution composition, element forming method, burning temperature, and evaluation results in these comparative examples are shown in Table 2. I-V characteristics of the piezoelectric element obtained in comparative Example 4 are indicated by the broken line b in FIG. 4.

Comparative Example 6

Preparation and evaluation of the piezoelectric element were conducted in the same manner as in the foregoing Example 37 using Upper Layer Forming Solution 9. Before forming the upper electrode, EPMA analysis was conducted from the surface on the upper side. As a result, Ba, Ti, and Pb were detected from the outermost surface portion on the upper side, and content of Pb was 17 weight percent. The solution composition, upper layer forming solution composition, element forming method, and evaluation results are shown in Table 2.

The foregoing results prove that the same effect is obtained both in the piezoelectric elements prepared by using the solutions according to Examples 21 to 38 of the invention and in the piezoelectric elements prepared by using paste according to Examples 1 to 20 of the invention.

When manufacturing Ink-jet printer heads using the piezoelectric elements obtained in the foregoing Example 3, Example 11, and Example 24, successful jetting of ink was confirmed in every ink-jet printer head. When manufacturing ink-jet printer heads provided with plural ink nozzles in the same manner, successful jetting of ink was confirmed also in these heads. This proves that the piezoelectric element according to the invention is quite useful as an ink-jet printer head.

What is claimed is:

1. A piezoelectric element in which electrodes are arranged on both sides of a piezoelectric film respectively, wherein said piezoelectric film is provided with an oxide layer containing 0 or not more than 15 weight percent of Pb arranged on a face of the piezoelectric film, said face being in contact with at least one of the electrodes, and said oxide layer being formed of a composite oxide expressed by a chemical formula $ABO_3$ or of a solid solution of one or not less than two kinds of composite oxides respectively expressed by the chemical formula $ABO_3$.

2. The piezoelectric element according to claim 1, wherein said oxide layer is formed of: a composite oxide a expressed by said chemical formula, $ABO_3$, in which A is one or not more than two kinds of elements selected among a group of alkaline-earth metals and Pb and B is one or not more than two kinds of elements selected among a group of Ti, Zr, and Sn; a composite oxide b expressed by said chemical formula, $ABO_3$, in which A is one or at least two kinds of elements of alkaline-earth metals and B is Nb and/or Ta; or a solid solution of said composite oxide a and said composite oxide b.

3. The piezoelectric element according to claim 1, wherein an oxide forming said oxide layer is a ferroelectric material.

4. The piezoelectric element according to any of claims 1 to 3, wherein said oxide layer contains not more than 5 weight percent of Pb.

5. The piezoelectric element according to claim 1, wherein said oxide layer is 0.05 µm to 1 µm in thickness.

6. The piezoelectric element according to claim 1, wherein said piezoelectric film is 1 µm to 25 µm in thickness.

7. The piezoelectric element according to claim 1, wherein said oxide layer is not more than 10% of said piezoelectric film in thickness.

8. The piezoelectric element according to claim 1, wherein said piezoelectric film comprises a composite oxide expressed by a chemical formula, $Pb(Zr_{1-x}Ti_x)O_3$, wherein $0.1 \leq x \leq 1$.

9. The piezoelectric element according to claim 1, wherein said piezoelectric film is formed of a solid solution of a composite oxide expressed by a chemical formula, $aPZT\text{-}b[Pb(C_{1/3}D_{2/3})O_3]\text{-}c[(Ba_{1-y}Sr_y)TiO_3]$; wherein C is an alkaline earth metal, Mg, Zn, Ni, Mn, Co or Fe; D is V, Nb or Ta; $0 \leq y \leq 1$, $a+b+c=1$, $0.6 \leq a \leq 1$, $0 \leq b \leq 0.4$, and $0 \leq c \leq 0.6$.

* * * * *